(12) United States Patent
Lin et al.

(10) Patent No.: US 11,279,850 B2
(45) Date of Patent: Mar. 22, 2022

(54) BULK RUTHENIUM CHEMICAL MECHANICAL POLISHING COMPOSITION

(71) Applicant: FUJIFILM ELECTRONIC MATERIALS U.S.A., INC., North Kingstown, RI (US)

(72) Inventors: David (Tawei) Lin, Chandler, AZ (US); Bin Hu, Chandler, AZ (US); Liqing (Richard) Wen, Mesa, AZ (US); Yannan Liang, Gilbert, AZ (US); Ting-Kai Huang, Taiwan (CN)

(73) Assignee: FUJIFILM ELECTRONIC MATERIALS U.S.A., INC., North Kingstown, RI (US)

( * ) Notice: Subject to any disclaimer, the term of this patent is extended or adjusted under 35 U.S.C. 154(b) by 0 days.

(21) Appl. No.: 16/299,935

(22) Filed: Mar. 12, 2019

(65) Prior Publication Data
US 2019/0300750 A1    Oct. 3, 2019

Related U.S. Application Data

(60) Provisional application No. 62/649,326, filed on Mar. 28, 2018.

(51) Int. Cl.
| | |
|---|---|
| *C09G 1/02* | (2006.01) |
| *H01L 21/321* | (2006.01) |
| *H01L 21/306* | (2006.01) |
| *C23F 1/00* | (2006.01) |
| *C23F 1/44* | (2006.01) |

(52) U.S. Cl.
CPC ............ *C09G 1/02* (2013.01); *C23F 1/00* (2013.01); *C23F 1/44* (2013.01); *H01L 21/30625* (2013.01); *H01L 21/3212* (2013.01)

(58) Field of Classification Search
CPC ..... C09G 1/02; C23F 1/44; C23F 1/00; H01L 21/30625; H01L 21/3212
See application file for complete search history.

(56) References Cited

U.S. PATENT DOCUMENTS

| 7,968,465 B2 | 6/2011 | Small et al. |
| 2006/0030158 A1 | 2/2006 | Carter et al. |
| 2007/0021040 A1 | 1/2007 | Kawata et al. |
| 2007/0090094 A1 | 4/2007 | Thompson et al. |
| 2008/0038995 A1 | 2/2008 | Small et al. |
| 2008/0398995 | 2/2008 | Small et al. |
| 2017/0081553 A1* | 3/2017 | Tamada ............ H01L 21/30625 |
| 2017/0088748 A1* | 3/2017 | Stender ............... H01L 21/3212 |
| 2018/0002571 A1* | 1/2018 | Stender ................ B24B 37/044 |

FOREIGN PATENT DOCUMENTS

TW          200524996 A    8/2005

OTHER PUBLICATIONS

International Search Report dated May 14, 2019 for PCT application No. PCT/US2019/021844.
Written Opinion dated May 14, 2019 for PCT application No. PCT/US2019/021844.
Taiwan Office Action with Search Report dated Jun. 2, 2020 for Taiwan application No. 108109825.
Korean Office Action dated Aug. 13, 2020 for Korean application No. 10-2019-0036013.
Chinese Office Action dated Sep. 2, 2020 for Chinese application No. 201910237774.9.
Chinese Office Action dated Apr. 16, 2021 for Chinese Appl. No. 201910237774.9.
Korean Office Action dated Feb. 23, 2021 for Korean Appl. No. 10-2019-0036013.
Taiwan Office Action dated Apr. 15, 2021 for Taiwan Appl. No. 108109825.
Chinese Office Action dated Nov. 30, 2021 for Chinese Appl. No. 201910237774.9.

* cited by examiner

*Primary Examiner* — Duy Vu N Deo
(74) *Attorney, Agent, or Firm* — Ohlandt, Greeley, Ruggiero and Perle, LLP

(57) ABSTRACT

The compositions of the present disclosure polish surfaces or substrates that at least partially include ruthenium. The composition includes a synergistic combination of ammonia and oxygenated halogen compound. The composition may further include abrasive and acid(s). A polishing composition for use on ruthenium materials may include ammonia, present in an amount of 0.01 wt % to 10 wt %, based on the total weight of the composition; hydrogen periodate, present in an amount of 0.01 wt % to 10 wt %, based on the total weight of the composition; silica, present in an amount of 0.01 wt % to 12 wt %, based on the total weight of the composition; and organic sulfonic add, present in an amount of 0.01 wt % to 10 wt %, based on the total weight of the composition, wherein the pH of the composition is between 6 and 8.

20 Claims, No Drawings

BULK RUTHENIUM CHEMICAL MECHANICAL POLISHING COMPOSITION

CROSS-REFERENCE TO RELATED APPLICATION

The present application claims the benefit of U.S. Provisional Patent Application 62/649,326, filed on Mar. 28, 2018, which is herein incorporated by reference.

BACKGROUND OF THE DISCLOSURE

1. Field of the Disclosure

The present disclosure provides a chemical mechanical polishing (CMP) composition that is advantageous for polishing ruthenium materials at a high rate. In particular, the CMP compositions of the present disclosure comprise, in part, a synergistic combination of ammonia and an oxygenated halogen compound, which may also be a perhalogenate compound or a halogen peroxy acid.

2. Description of the Related Art

In back-end-of-line (BEOL) applications in the semiconductor industry, ruthenium is one of the next generation interconnect materials, because of its superior filing capability and good conductivity. Unlike some other materials, such as cobalt, ruthenium is relatively chemically stable and thus does not deteriorate. It also has favorable deposition properties. However, ruthenium can be difficult to remove during a CMP process. Accordingly, there is a need for a CMP composition that removes ruthenium at sufficiently high rates.

SUMMARY OF THE DISCLOSURE

In one embodiment, the present disclosure provides a CMP composition that comprises a synergistic combination of ammonia and oxygenated halogen compound. The composition may also comprise abrasives, acids, and other stabilizers and removal rate enhancers.

In another aspect, embodiments disclosed herein relate to polishing compositions for use on ruthenium, including ammonia; an oxygenated halogen compound; an abrasive; and optionally, an acid; wherein the pH of the composition is between about 5 and about 10. The present disclosure also provides a method of removing ruthenium material from a substrate, comprising the step of applying the above-identified composition to the substrate while polishing the substrate with a rotating polishing pad.

In yet another aspect, embodiments disclosed herein relate to polishing compositions for use on ruthenium materials, including ammonia, present in an amount of about 0.01 wt % to about 10 wt %, based on the total weight of the composition; hydrogen periodate, present in an amount of about 0.01 wt % to about 10 wt %, based on the total weight of the composition; silica, present in an amount of about 0.01 wt % to about 12 wt %, based on the total weight of the composition; and organic sulfonic acid, present in an amount of about 0.01 wt % to about 10 wt %, based on the total weight of the composition, wherein the pH of the composition is between about 6 and about 8.

In yet another aspect, embodiments disclosed herein relate to polishing slurry concentrates for use on ruthenium materials, including: a Ru surface passivation layer softener; a removal rate enhancer; an abrasive; and a Ru oxidizer; wherein the pH of the composition is between about 6 and 8.

DETAILED DESCRIPTION OF THE DISCLOSURE

The CMP compositions of the present disclosure address the problem of polishing and removing ruthenium material at a satisfactorily high rate from a layered semiconductor device. The CMP compositions of the present disclosure comprise a synergistic combination of ammonia and oxygenated halogen compound, for example periodate. Throughout this application ammonia may also be referred to as ammonium hydroxide, which is the form that ammonia takes when dissolved in an aqueous solution, such as the CMP compositions of the present disclosure. The combination is synergistic since, as discussed in greater detail below, the ruthenium removal rate of a composition including both of these ingredients is far greater that what one would expect based on the ruthenium removal rates of compositions containing each component alone.

Without being bound by theory, it is believed that the present combination of ammonia and the oxygenated halogen compound is so advantageous because the oxygenated halogen first oxidizes ruthenium easily. The ammonia can then easily complex with ruthenium oxide. One example of this ammonium-ruthenium oxide complex can have the following structure and formula:

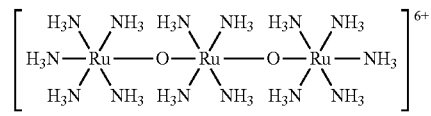

The oxygenated halogen compound of the present disclosure serves as an oxidizer for ruthenium. When the ruthenium oxide is formed, and complexed with ammonia, it can be removed by mechanical action of the abrasive. The halogen can be any from the known group, such as but not limited to iodine, bromine, or chlorine. In one embodiment, the oxygenated halogen compound is hydrogen periodate, which has the chemical formula $HIO_4$ (meta form) or $H_5IO_6$ (ortho form). Other suitable compounds include hydrogen bromate, or hydrogen chlorate. The oxygenated halogen compound can be present in an amount of 0.01 wt % to 10 wt %, based on the total weight of the composition, or any subranges therebetween. The oxygenated halogen compound can also be present in an amount of 0.01 wt % to 2 wt %, based on the total weight of the composition, or any subranges therebetween.

As discussed above, ammonia can react or complex with the ruthenium oxide formed after reaction with the oxygenated halogen compound. Ammonia can be present in an amount of 0.01 wt % to 10 wt %, based on the total weight of the composition, or any subranges therebetween. Ammonia can also be present in an amount of 0.01 wt % to 1 wt %, based on the total weight of the composition, or any subranges therebetween.

The present disclosure contemplates that other hydroxide compounds may be used in place of ammonia/ammonium hydroxide, though as discussed below they may not work as well. In particular, potassium hydroxide may still work well enough with the oxygenated halogen compound of the present disclosure to produce a sufficiently high ruthenium removal rate.

The composition of the present disclosure also includes abrasives. The abrasives can be selected from the group consisting of alumina, silica, titania, ceria, zirconia, co-formed products thereof, or mixtures thereof. The abrasive can be present in an amount of 0.01 wt % to 12 wt %, based on the total weight of the composition, or any subranges therebetween. The abrasive can also be present in an amount of 0.01 wt % to 6 wt %, based on the total weight of the composition, or any subranges therebetween.

The composition of the present disclosure also includes acids, which serve as removal rate enhancers or surfactants for roughness surface control of ruthenium. The acids of the present disclosure can be selected from the group consisting of carboxylic acids, organic sulfonic acids, organic phosphonic acids, or any combinations thereof. Examples of organic sulfonic acids include 1,2-ethanedisulfonic acid, 4-amino-3-hydroxy-1-naphthalenesulfonic add, 8-hydroxyquinoline-5-sulfonic add, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic add, P-toluenesulfonic add, and trifluoromethane-sulfonic acid. Examples of organic phosphonic acids include poly(vinylphosphonic acid), 1-hydroxyethane-1,1-diphosphonic acid, nitrilotri(methylphosphonic acid), diethylenetriaminepentakis (methylphosphonic acid), N,N,N',N'-ethylenediaminetetrakis(methylene phosphonic acid), n-hexylphosphonic acid, benzylphosphonic acid and phenylphosphonic acid. The acid can be present in an amount of 0.01 wt % to 10 wt %, based on the total weight of the composition, or any subranges therebetween. The acid can also be present in an amount of 0.01 wt % to 1 wt %, based on the total weight of the composition, or any subranges therebetween.

The pH of the composition should be set in a slightly acidic to neutral to slightly alkaline range, as this leads to a higher removal rate of ruthenium. Thus, the pH can be from 5 to 10, or any subranges therebetween, or from 6 to 8, or any subranges therebetween.

In one optional embodiment, the compositions of the present disclosure are substantially free of azoles, such as benzotriazole and its derivatives. As used in the present disclosure, "substantially free of" can mean 10 ppm or less, or 5 ppm or less, or 1 ppm or less. In another embodiment, the compositions of the present disclosure do not include any azole compounds.

The composition of the present disclosure is summarized in the following table:

TABLE 1

| | Broad Range, wt % | Component Function |
|---|---|---|
| Ammonia/Ammonium Hydroxide | 0.01 to 10 | Counter ion, Ru surface passivation layer softener |
| Acid | 0.01 to 10 | Removal rate enhancer or polymer surfactant for Ru surface roughness control |
| Abrasive | 0.01 to 12 | Abrasive |
| Oxygenated halogen | 0.01 to 10 | Ru Oxidizer |

In one or more embodiments, the compositions of the present disclosure may include less than 1%, or less than 0.1% by weight of other additives/components not listed in Table 1 and described previously in the present application with respect to each component. In one or more embodiments, the compositions of the present disclosure consist of only the components listed in Table 1 and described previously in the present application with respect to each component, and water. For example, in some embodiments, the compositions of the present disclosure may specifically exclude one or more of the following additive components, or any combinations thereof. Such components are selected from the group consisting of polymers having a molecular weight of greater than 250 g/mol or greater than 500 g/mol, or greater than 1000 g/mol, or in some embodiments greater than 2000 g/mol, oxygen scavengers, quaternary ammonium salts (including quaternary ammonium hydroxides such as TMAH), amines, alkali bases such as KOH, NaOH and LiOH, surfactants other than a defoamer, a defoamer, fluoride containing compounds, silicates, hydroxycarboxylic acids containing more than two hydroxyl groups, carboxylic and polycarboxylic acids lacking amino groups, silanes (e.g., alkoxysilanes), cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), buffering agents, non-azole corrosion inhibitors, and metal salts (e.g., metal halides).

EXAMPLES

Examples are provided to further illustrate the capabilities of the polishing compositions and methods of the present disclosure. The provided examples are not intended and should not be construed to limit the scope of the present disclosure.

For all examples, an Applied Materials Mirra CMP polisher was used with a downforce of 1.5 psi and a flow rate of 1.75 mL/min to polish SKW CVD Ru wafers.

Table 1a below shows removal rate data for titanium, ruthenium, and tetra-ethyl-ortho-silicate (TEOS), for several example compositions of the present disclosure. Two different types of ruthenium layers were tested, namely those applied with a physical vapor deposition (PVD) and a chemical vapor deposition (CVD).

TABLE 1a

| | EX1 | EX2 | EX3 |
|---|---|---|---|
| $NH_3$ (% wt, net) | 0.1797 | 0.0449 | 0.1797 |
| Organic sulfonic acid (% wt, net) | 0.1 | 0.05 | 0.1 |
| Abrasive (% wt, net solids) | 2 | 0.5 | 0.5 |
| $H_5IO_6$ (% wt, net) | 1.5 | 0.38 | 1.5 |
| pH | 6.85 | 7.32 | 6.75 |
| PVD Ru RR (A/min): | 2700 | 516 | 2352 |
| CVD Ru RR (A/min): | 2460 | 624 | 2724 |
| Ti RR (A/min) | 101 | 20 | 34 |
| TEOS RR (A/min) | 188 | 41 | 58 |

EX2 is a 4× dilution of EX 1. EX3 is the same composition as EX1, with the amount of silica abrasive reduced to 0.5 wt %. As can be seen, each of EX1-EX3 have high ruthenium removal rates and low Ti and TEOS removal rates. Importantly, the compositions of the present disclosure remove ruthenium applied via PVD and CVD equally well.

Table 1b shows removal rate data for several additional compositions of the present disclosure, where the amount of ammonia and periodate are varied.

TABLE 1b

|  | EX4 | EX5 | EX6 | EX7 |
|---|---|---|---|---|
| $NH_3$ (% wt, net) | 0.040 | 0.100 | 0.140 | 0.180 |
| Organic sulfonic acid (% wt, net) | 0.03 | 0.03 | 0.03 | 0.03 |
| Abrasive (% wt, net solids) | 0.50 | 0.50 | 0.50 | 0.50 |
| $H_5IO_6$ (% wt, net) | 0.38 | 0.80 | 1.20 | 1.50 |
| pH | 7.0 | 7.0 | 7.0 | 7.0 |
| CVD Ru RR (A/min): | 636 | 1356 | 2028 | 2604 |

As can be seen in Table 1b, when the amount of ammonia and periodate are increased, the ruthenium removal rate can be very high.

Table 2 below shows a sample composition of the present disclosure, wherein ammonia is compared to other compounds in the hydroxide family.

TABLE 2

|  | EX8 | CE1 | EX9 | CE2 | CE3 |
|---|---|---|---|---|---|
| $NH_3$ (% wt, net) | 0.04 |  |  |  |  |
| NaOH (% wt, net) |  | 0.09 |  |  |  |
| KOH (% wt, net) |  |  | 0.08 |  |  |
| Tetramethylammonia-hydroxide (% wt, net) |  |  |  | 0.19 |  |
| Monoethanolamine (% wt, net) |  |  |  |  | 0.20 |
| Organic sulfonic acid (% wt, net) | 0.03 | 0.03 | 0.03 | 0.03 | 0.03 |
| Abrasive (% wt, net solids) | 0.50 | 0.50 | 0.50 | 0.50 | 0.50 |
| $H_5IO_6$ (% wt, net) | 0.38 | 0.38 | 0.38 | 0.38 | 0.38 |
| pH | 6.5 | 6.5 | 6.5 | 6.5 | 6.5 |
| CVD Ru RR (A/min): | 722 | 274 | 522 | 318 | 48 |

EX8, EX9, and CE1-CE3 are the same with the exception of the ammonia and hydroxide compounds used. The wt. % of the ammonia and hydroxide compounds used in these compositions varies so as to keep the pH constant. As can be very clearly seen, even at very low amounts of ammonia, EX8 of the present disclosure provides a very high removal rate of ruthenium. CE1-CE3 contain higher amounts of hydroxides, and provide much lower ruthenium removal rates. This improved result is due to the beneficial and unexpected effects of how ammonia, the oxygenated halogen compound, and ruthenium work together in the manner described above. In EX9, potassium hydroxide is used. As is also discussed above, while not as effective as ammonia, potassium hydroxide may exhibit sufficiently high removal rates of ruthenium to be used in ammonia's stead.

Table 3a shows data where the ammonia of the present disclosure is replaced with sodium hydroxide, and the amount of periodate is varied.

TABLE 3a

|  | CE4 | CE5 | CE6 | CE7 |
|---|---|---|---|---|
| $NH_3$ (% wt, net) |  |  |  |  |
| NaOH (%) | 0.085 | 0.171 | 0.264 | 0.370 |
| Organic sulfonic acid (% wt, net) | 0.025 | 0.025 | 0.025 | 0.025 |
| Abrasive (% wt, net solids) | 0.50 | 0.50 | 0.50 | 0.50 |
| $H_5IO_6$ (% wt, net) | 0.40 | 0.80 | 1.20 | 1.60 |
| POU pH | 7.0 | 7.0 | 7.0 | 7.0 |
| CVD Ru RR (A/min): | 260 | 644 | 896 | 1936 |

Table 3a shows that increasing the amount of periodate can increase the removal rate of ruthenium. However, CE7, EX3 (from Table 1a), and EX7 (from Table 1b) have a similar amount of periodate, in fact CE7 has slightly more than the other two (1.60 wt % to 1.5 wt %). The ruthenium removal rate of CE7 is only 1936 Angstroms/min for CVD. By contrast, the CVD ruthenium removal rate for EX3 is 2724 Angstroms/min, and the CVD ruthenium removal rate for EX7 is 2604 Angstroms/min. The main difference between the two compositions is the amount of ammonia in EX3 and EX7. This is a clear indication that ammonia improves the ruthenium removal rate of periodate significantly.

Table 3b illustrates concept this even more clearly. In Table 3b, the amount of ammonia is varied, while the periodate is replaced with propionic acid, a compound that is a metal oxidizer in CMP compositions.

TABLE 3b

|  | CE8 | CE9 | CE10 | CE11 |
|---|---|---|---|---|
| $NH_3$ (% wt, net) | 0.045 | 0.090 | 0.135 | 0.180 |
| NaOH (%) |  |  |  |  |
| Organic sulfonic acid (% wt, net) | 0.025 | 0.025 | 0.025 | 0.025 |
| Abrasive (% wt, net solids) | 0.50 | 0.50 | 0.50 | 0.50 |
| $H_5IO_6$ (% wt, net) |  |  |  |  |
| PA (% wt, net) | 0.168 | 0.342 | 0.515 | 0.679 |
| POU pH | 7.0 | 7.0 | 7.0 | 7.0 |
| CVD Ru RR (A/min): | 0 | 0 | 0 | 0 |

As is clearly shown, ammonia itself has no ability to remove ruthenium without periodate or the other oxygenated halogen compounds of the present disclosure. This is true even when the amount of ammonia is increased. Since ammonia has no ability to remove ruthenium on its own, the fact that it would boost the ability of oxygenated halogen compound to remove ruthenium so significantly was completely unexpected.

Table 4 shows the effect of using other oxidizers than the oxygenated halogen compound of the present disclosure.

TABLE 4

|  | CE12 | CE13 | EX10 |
|---|---|---|---|
| $NH_3$ (% wt, net) | 0.05 | 0.05 | 0.05 |
| $H_2O_2$ (% wt, net) | 0.50 |  |  |
| NaClO (% wt, net) |  | 0.25 |  |
| $H_5IO_6$ (% wt, net) |  |  | 0.38 |
| $SiO_2$ (% wt, net) | 0.50 | 0.50 | 0.50 |
| pH | 7.0 | 7.0 | 7.0 |
| CVD Ru RR (A/min): | 58 | 235 | 659 |

CE12 (hydrogen peroxide) and CE13 (sodium chlorate) exhibit significantly lower ruthenium removal rates than EX10, which is a composition according to the present disclosure.

Table 5 shows the effect of pH on the compositions of the present disclosure.

TABLE 5

|  | EX11 | EX12 | EX13 | CE14 | CE15 |
|---|---|---|---|---|---|
| $NH_3$ (% wt, net) | 0.03 | 0.04 | 0.05 | 0.07 | 0.09 |
| Organic sulfonic acid (% wt, net) | 0.03 | 0.03 | 0.03 | 0.03 | 0.03 |
| Abrasive (% wt, net solids) | 0.50 | 0.50 | 0.50 | 0.50 | 0.50 |
| $H_5IO_6$ (% wt, net) | 0.38 | 0.38 | 0.38 | 0.38 | 0.38 |
| pH | 6 | 6.5 | 8 | 8.5 | 9 |
| CVD Ru RR (A/min) | 756 | 822 | 522 | 444 | 336 |

TABLE 5-continued

|  | EX11 | EX12 | EX13 | CE14 | CE15 |
|---|---|---|---|---|---|
| Ti RR (A/min) | 25 | 26 | 33 | 35 | 39 |
| TEOS RR (A/min) | 40 | 39 | 33 | 33 | 33 |

As can be seen in Table 5, the composition of the present disclosure shows very high removal rates for ruthenium compared to Ti or TEOS in slightly acidic, neutral, or slightly alkaline environments. When the pH becomes too highly alkaline, the removal rate can suffer.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A ruthenium polishing composition, comprising:
   ammonia, present in an amount of about 0.03 wt % to about 0.05 wt %, based on the total weight of the composition;
   an oxygenated halogen compound, present in an amount of about 0.01 wt % to about 10 wt %, based on the total weight of the composition, wherein the oxygenated halogen compound comprises a halogen selected from the group consisting of iodine, bromine, chlorine, and any combinations thereof;
   an abrasive;
   water;
   optionally, an acid; and
   less than about 1 wt % of any additional components,
   wherein the pH of the polishing composition is between about 6 and about 8,
   wherein the composition excludes tetra methyl ammonium hydroxide, and
   wherein, at a downforce of 1.5 psi and a flow rate of 175 mL/min, the composition polishes CVD ruthenium and tetraethyl ortho silicate (TEOS) at a selectivity ratio of ruthenium to TEOS that is 15.82 or greater.

2. The composition of claim 1, wherein the oxygenated halogen compound is hydrogen periodate.

3. The composition of claim 1, wherein the abrasive is selected from the group consisting of alumina, silica, titania, ceria, zirconia, co-formed products thereof, and any combinations thereof.

4. The composition of claim 1, wherein the abrasive is silica.

5. The composition of claim 1, wherein the abrasive is present in an amount of about 0.01 wt % to about 12 wt %, based on the total weight of the composition.

6. The composition of claim 1, wherein the abrasive is present in an amount of about 0.01 wt % to about 6 wt %, based on the total weight of the composition.

7. The composition of claim 1, wherein the acid is selected from the group consisting of a carboxylic acid, an organic sulfonic acid, an organic phosphonic acid, or any combinations thereof.

8. The composition of claim 1, wherein the acid is selected from the group consisting of 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, P-toluenesulfonic acid, and trifluoromethane-sulfonic acid, poly(vinylphosphonic acid), 1-hydroxyethane-1,1-diphosphonic acid, nitrilotri(methylphosphonic acid), diethylenetriaminepentakis (methylphosphonic acid), N,N,N'N'-ethylenediaminetetrakis(methylene phosphonic acid), n-hexylphosphonic acid, benzylphosphonic acid, phenylphosphonic acid, and any combinations thereof.

9. The composition of claim 1, wherein the acid is present in an amount of about 0.01 wt % to about 10 wt %, based on the total weight of the composition.

10. The composition of claim 1, wherein the acid is present in an amount of about 0.01 wt % to about 1 wt %, based on the total weight of the composition.

11. The composition of claim 1, wherein the composition is substantially free of azoles.

12. The composition of claim 1, wherein the composition consists of the ammonia, the oxygenated halogen compound, the abrasive, the water, and optionally the acid.

13. The polishing composition of claim 1,
   wherein the abrasive is silica, present in an amount of about 0.01 wt % to about 12 wt %, based on the total weight of the composition, and
   wherein the acid is an organic sulfonic add present in an amount of about 0.01 wt % to about 10 wt %, based on the total weight of the composition.

14. A method of removing ruthenium material from a substrate, comprising the step of applying the composition of claim 1 to the substrate while polishing the substrate with a rotating polishing pad.

15. A ruthenium polishing composition, comprising:
   a ruthenium surface passivation layer softener comprising ammonia in an amount of about 0.03 wt % to about 0.05 wt %;
   a removal rate enhancer;
   an abrasive;
   a ruthenium oxidizer comprising hydrogen periodate;
   water; and
   less than about 1 wt % of any additional components,
   wherein the pH of the composition is between about 6 and 8.

16. A ruthenium polishing composition, comprising:
   ammonia, present in an amount of about 0.03 wt % to about 0.05 wt %;
   hydrogen periodate, present in an amount of about 0.01 wt % to about 10 wt %, based on the total weight of the composition;
   an abrasive;
   an acid;
   water; and
   less than about 1 wt % of any additional components,
   wherein the pH of the polishing composition is between about 7 and about 8.

17. The composition of claim 16, wherein the acid is selected from the group consisting of a carboxylic acid, an organic sulfonic acid, an organic phosphonic acid, or any combinations thereof.

18. The composition of claim 16, wherein the acid is selected from the group consisting of 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, P-toluenesulfonic acid, and trifluoromethane-sulfonic acid, poly(vinylphosphonic acid), 1-hydroxyethane-1,1-diphosphonic acid, nitrilotri(methylphosphonic acid), diethylenetriaminepentakis (methylphosphonic acid), N,N,N'N'-ethylenediaminetetrakis(methylene phosphonic acid), n-hexylphosphonic acid, benzylphosphonic acid, phenylphosphonic acid, and any combinations thereof.

19. The composition of claim 16, wherein the acid is present in an amount of about 0.01 wt % to about 10 wt %, based on the total weight of the composition.

20. The composition of claim 16, wherein the acid is present in an amount of about 0.01 wt % to about 1 wt %, based on the total weight of the composition.

* * * * *